(12) United States Patent
Lue et al.

(10) Patent No.: US 6,264,467 B1
(45) Date of Patent: Jul. 24, 2001

(54) MICRO GROOVED SUPPORT SURFACE FOR REDUCING SUBSTRATE WEAR AND SLIP FORMATION

(75) Inventors: Brian Lue, Mountain View; Andreas G. Hegedus, Burlingame; Dean Jennings, San Ramon; Candy Ching-Fai Siu, San Francisco, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/291,909

(22) Filed: Apr. 14, 1999

(51) Int. Cl.[7] ....................................................... F27D 5/00
(52) U.S. Cl. ........................ 432/253; 432/258; 211/41.18
(58) Field of Search .................................. 432/253, 258, 432/259, 239; 211/41.18; 206/454

(56) References Cited

U.S. PATENT DOCUMENTS

| | | | |
|---|---|---|---|
| 4,529,899 | 7/1985 | Mabuchi et al. | 310/40 |
| 5,283,089 | * 2/1994 | Bates | 432/253 |
| 5,466,979 | 11/1995 | Bryant et al. | 310/248 |
| 5,534,074 | * 7/1996 | Koons | 206/454 |
| 5,718,574 | * 2/1998 | Shimazu | 432/253 |
| 5,840,125 | * 11/1998 | Gronet et al. | 118/730 |
| 5,848,889 | * 12/1998 | Tietz et al. | 432/258 |

OTHER PUBLICATIONS

S. Türker Oktay, Nam P. Suh, "Wear Debris Formation and Agglomeration", Transactions of the ASME, vol. 114, Apr. 1992, p. 379–393.

Bryant et al., "Effects of micro (rocking) vibrations and surface waviness on wear and wear debris," Wear, vol. 216 (1998), pp. 60–69.

* cited by examiner

*Primary Examiner*—Gregory Wilson
(74) *Attorney, Agent, or Firm*—Blakely Sokoloff Taylor & Zafman

(57) ABSTRACT

A novel apparatus and method of making the apparatus for supporting a substrate during processing. A base defining grooves at a substrate support location is described. Grooves are provided to catch wear particles from the substrate caused by friction during relative movement between the substrate and the support. A plurality of substrate support locations can be provided on the base surface. The base surface preferably comprises an annulus with substrate support locations spaced circumferentially around the annulus. Protrusions may be provided at substrate support locations. The protrusions define contact surfaces on which grooves can be formed.

38 Claims, 16 Drawing Sheets

MICRO GROOVED SUPPORT SURFACE FOR REDUCING SUBSTRATE WEAR AND SLIP FORMATION

FIELD OF THE INVENTION

The present invention relates generally to the field of substrate processing for semiconductor manufacturing, and more specifically, to an improved apparatus and method for supporting a silicon substrate or wafer during a process such as rapid thermal processing.

BACKGROUND OF THE INVENTION

An important step in the process of integrated circuit manufacturing is the processing of the semiconductor substrate in which active devices such as transistors and capacitors that comprise the integrated circuits are formed. The semiconductor or silicon substrate must be manufactured to extremely precise specifications and quality standards. As in any manufacturing industry, minimization of defects is an important consideration. For example, because the active devices that are formed on the silicon substrate are microscopic in size, any defect in the substrate, even on the molecular level, will decrease yield and therefore increase the cost of manufacturing integrated circuits.

In the field of semiconductor substrate processing, defects in the top approximately 100 microns of thickness of a semiconductor substrate are a particular problem because that is where the active devices are formed. While a certain minimal level of defects may be acceptable in the lower portion of the substrate, a defect that has developed in the top 100 microns of the substrate is generally unacceptable.

A common defect is the formation of dislocations within the silicon substrate. A scratch on the back side of a substrate caused by the edge ring or carrier on which the substrate is held or transported can cause dislocations in the crystal lattice that can travel throughout the thickness of the substrate.

One known cause of substrate defects is friction, which causes injury to the back side or supported side of the silicon substrate in the form of scratches or gouges. Friction results from contact and relative movement between the silicon substrate and a supporting surface of a carrier of the substrate such as an edge ring. Relative movement can be caused by thermal expansion or the momentum of the substrate during acceleration or deceleration of the carrier. Sheer or normal forces on the surface of the substrate can also cause dislocations.

Dislocations resulting from friction are typically caused by microcutting, gouging, or galling, for example. These exemplary modes of causing damage to the substrate surface are typically the result of microscopic roughness of the contacting surfaces of the carrier and the substrate material. Considerable effort has been expended to control roughness and to decrease friction between the contacting surfaces.

The microscopic surface roughness on contacting surfaces can cause microcuts and protrusions that can cause gouges in the silicon substrate. Microcutting and gouging create particles that can break away from the surface of the substrate. Adhesion and shearing create microparticles that agglomerate to larger particles. Larger particles then fall to the edge ring or carrier surface and can become compacted into a substrate particle "snowball" to form micromountains that accelerate the gouging. While some level of scratching on the back side of the substrate is usually acceptable, when the scratching rises to the level of gouging, the surface defects are no longer acceptable and can cause waste in the form of defective substrate parts.

One exemplary process during which defects in a substrate can develop is Rapid Thermal Processing ("RTP"). A typical RTP chamber consists of an array of heat sources such as lamps that provide heat energy across the surface of a silicon substrate. Many types of supporting surfaces and devices are used in transporting and holding silicon substrates during processes such as RTP. The substrate is typically in the form of a disk-shaped silicon wafer, which rests on a support ring or edge ring that is typically made of silicon carbide (SiC). A typical edge ring comprises an annulus that has an inner diameter that is slightly smaller than the diameter of the silicon wafer and a step formed on the annulus which creates a circular pocket having a diameter slightly larger than the diameter of the wafer. The silicon substrate or wafer is placed on the circular pocket. Heat energy also can be provided from below the support ring that carries the substrate because the bottom side of the substrate is exposed to a heat source through an opening in the central portion of the ring. As in most steps in the manufacturing of integrated circuits and semiconductors, the process must be performed within a clean room environment.

In the case of RTP, the substrate is subjected to extreme and fast changes in temperature, which cause contraction and expansion of the substrate material and the support on which the substrate is held. The substrate material can expand and contract at a different rate than the material of the carrier on which the substrate is being held during RTP. As a result, the relative movement between the substrate and its support caused by expansion and contraction causes friction, which in turn causes scratches or gouging in the substrate. Scratching and gouges then result in dislocations within the material of the substrate. Also, the silicon substrate becomes softened in the high temperature atmosphere of RTP. Temperatures in the RTP chamber can range from 200° C. to 1300° C. and can change at a rate of 300° C. per second. The softened material results in agglomeration of wear particles and more gouging.

Another important component of quality control in the semiconductor manufacturing process is the periodic cleaning of substrate carrier surfaces to remove microscopic wear particles that accumulate during repeated cycles of use. Currently, carrier surfaces such as those on edge rings are cleaned after a selected number of cycles of carrying wafers. The cleaning process involves time and expense, and is environmentally undesirable because of the solvents or chemicals that are currently used. The cleaning process creates inefficiency because the machine incorporating the carrier must be stopped during cleaning or for removal and replacement of the carrier surface. It is desirable to process as many substrate pieces as possible before cleaning becomes necessary.

Thus, what is needed is a novel method and apparatus for supporting a substrate during processing which reduces the build-up of wear particles and thus decreases damage to the substrate.

SUMMARY OF THE INVENTION

A novel apparatus and method of making the apparatus for supporting a substrate during processing are described. An embodiment of the invention is a substrate support apparatus including a base surface and grooves formed in the base surface at a substrate support location. Preferably, the apparatus includes a plurality of substrate support locations. Substrate support locations can also include protrusions extending from the base surface.

The grooves provided in the base surface or on contact surfaces on the protrusions are sized to catch wear particles that are created as a result of friction caused by the relative movement between the substrate and the support that occurs during processing. As the wear particles fall into the grooves, they are moved away from the substrate surface. Thus, the occurrence of scratches or gouges in the substrate surface is decreased.

The base surface comprises an annulus in one embodiment. The grooves or the substrate support locations can be spaced circumferentially around the annulus.

In one embodiment, the grooves are formed radially with respect to the annulus. In another embodiment, protrusions are provided at substrate support locations. The protrusions define contact surfaces on which grooves can be formed.

An exemplary process for which the invention can be used is Rapid Thermal Processing ("RTP"). In use, a silicon substrate, for example, is placed on the base surface of a support that will carry or hold the substrate during the process. In the example of RTP, both the substrate material and the support expand and contract during the heating and cooling cycles of RTP. The different rates of thermal expansion and contraction of the substrate material relative to the support material cause relative movement between the substrate and base surface. Also, acceleration and deceleration of the support during movement of the substrate from one part of the machine to another cause relative movement. The relative movement creates friction which results in wear particles that can create scratches or gouges in the substrate surface.

Still other advantages of the present invention will become obvious from the detailed description, which follows.

BRIEF DESCRIPTION OF THE DRAWINGS

The present invention is illustrated by way of example, and not limitation, in the figures of the accompanying drawings in which.

DETAILED DESCRIPTION

An improved apparatus and method of making the apparatus for supporting a substrate is described. In the following description numerous specific details are set forth, such as specific equipment and materials, etc., in order to provide a thorough understanding of the present invention. It will be obvious, however, to one skilled in the art that the present invention may be practiced without these specific details. In other instances, well-known machines and methods for making such machines have not been described in particular detail in order to avoid unnecessarily obscuring the present invention.

The present invention is an apparatus for supporting a substrate that reduces wear due to friction during processing of the substrate. The apparatus provides grooves in a supporting surface which provide a trap for wear particles that can otherwise cause scratches or gouges in the substrate. Grooves also decrease the total area of contact between the substrate and the supporting surface, thus minimizing the number of locations at which scratches or gouges can occur.

The scratches or gouges caused by the wear particles can cause dislocations in the crystal lattice of the substrate material. The dislocations are undesirable if they develop in a critical portion of the thickness of the substrate, the critical portion of a silicon substrate usually being the top 100 microns of thickness of the substrate where devices are fabricated.

Figure 1:
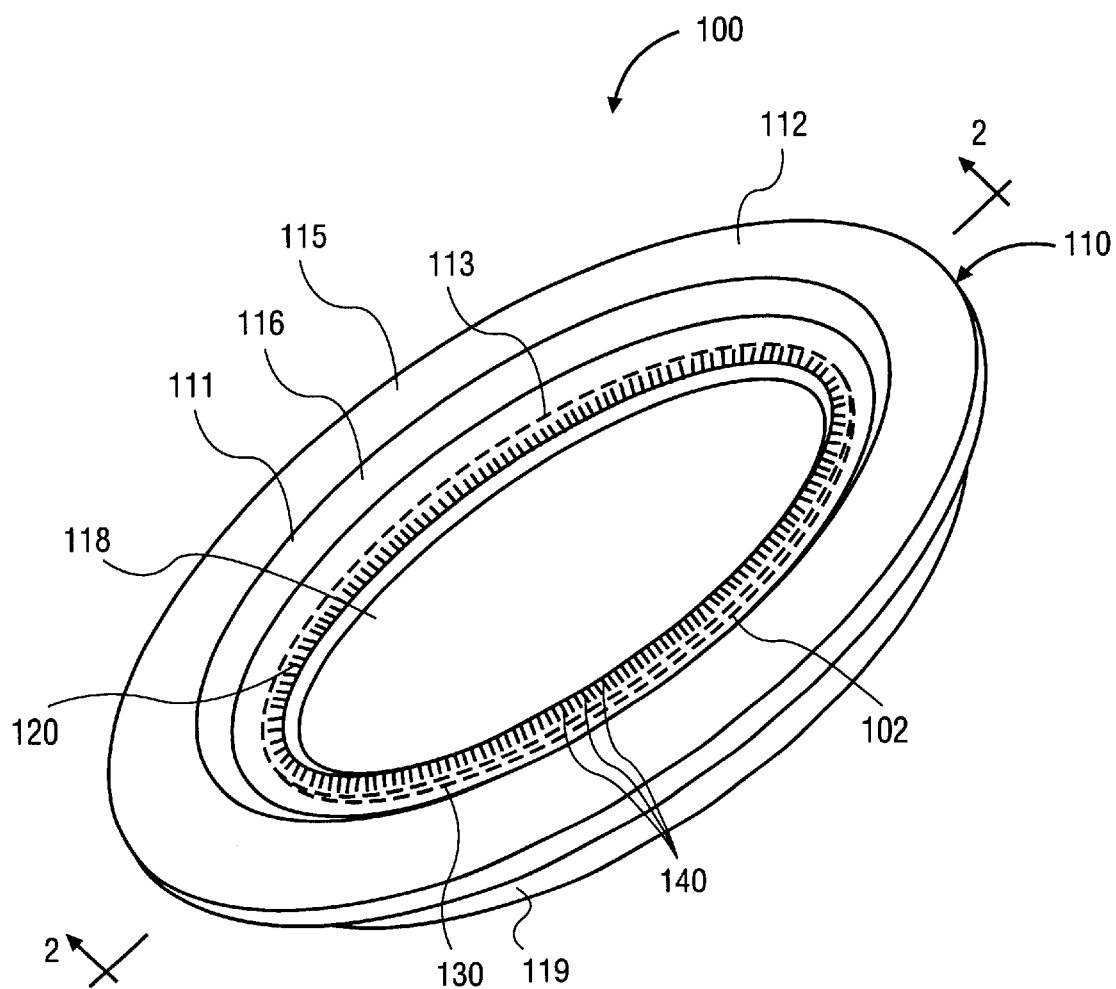
FIG. 1 is a perspective view of a substrate support apparatus of the present invention embodied in an edge ring.

A substrate support apparatus, one embodiment of which is an edge ring 100, shown in FIG. 1, exemplifies the present invention. Edge ring 100 can be used to carry a substrate 102 in a substrate processing apparatus or machine such as, for example, an RTP chamber, a chemical vapor deposition apparatus ("CVD"), or an etching apparatus.

FIG. 1 shows edge ring 100 including a base 110. Base 110 has a base surface 120 on which substrate support location 130 is located. Base 110 defines grooves 140 at the substrate support location 130. In the example of FIG. 1, grooves 140 are defined over the entire substrate support location 130, which is disposed around the inner circumference of base surface 120.

Figure 2:
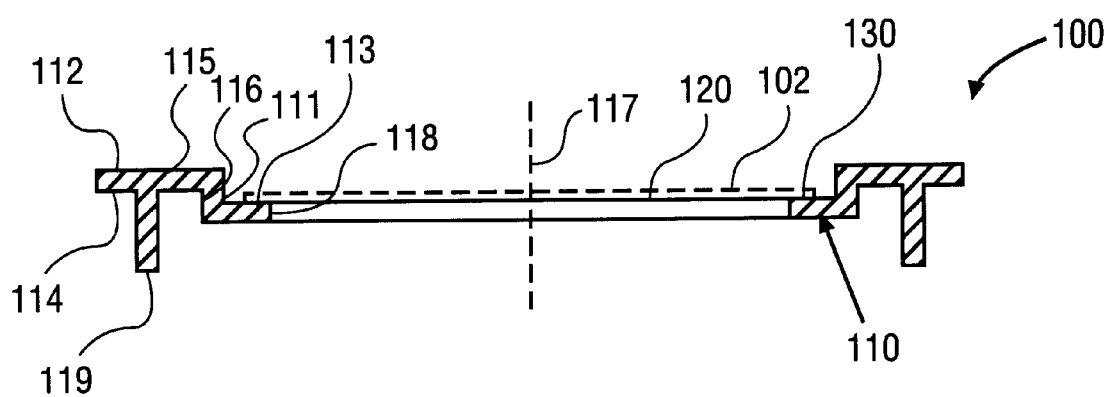
FIG. 2 is a cross-sectional view of the edge ring taken along line 2—2 of FIG. 1.
Figure 3:
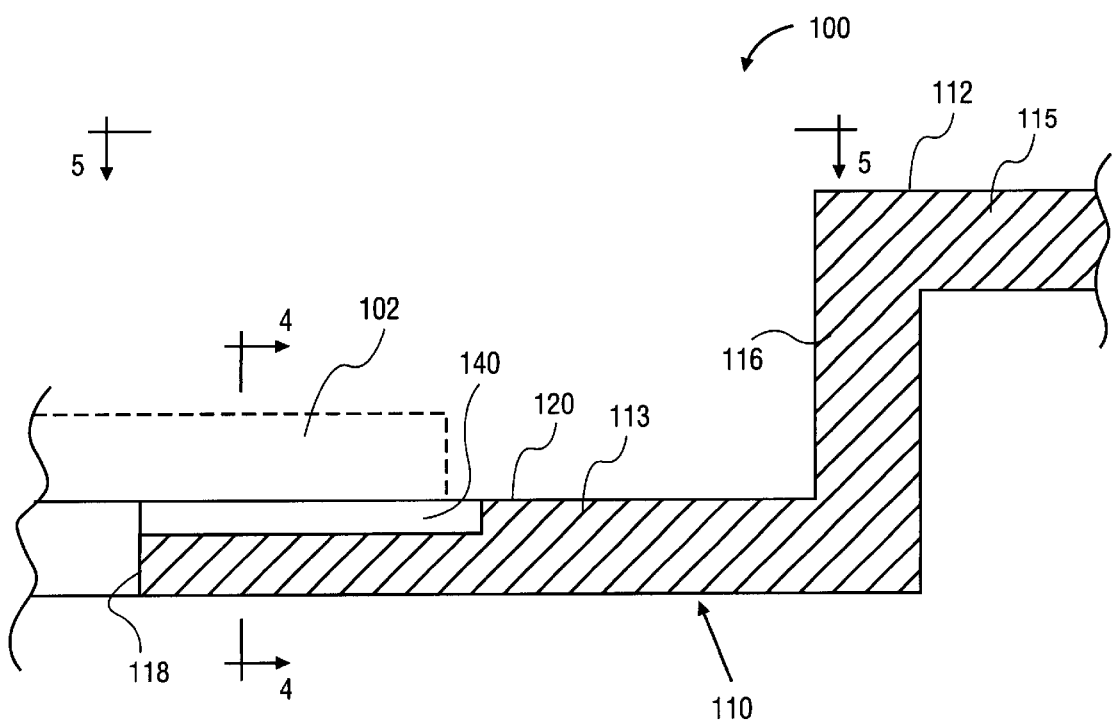
FIG. 3 is an enlarged partial cross-sectional view of the edge ring of FIG. 2.

FIG. 2 shows substrate 102 supported on base 110 at base surface 120. FIG. 3 is an enlarged view of a portion of the base 110 of FIG. 2. FIG. 3 shows substrate 102 supported at base surface 120 and groove 140 defined by base 110 below base surface 120.

Figure 4:
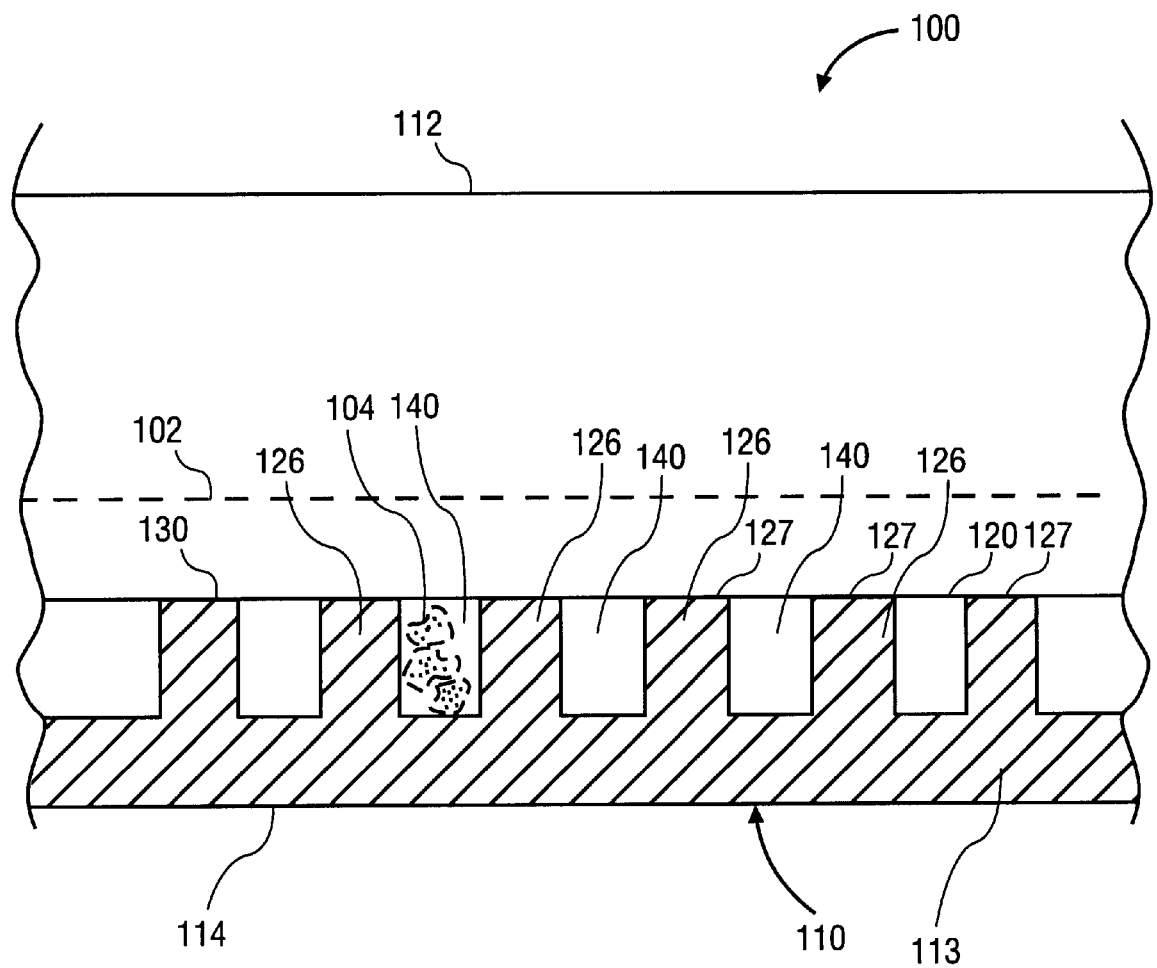
FIG. 4 is an enlarged partial cross-sectional view of the edge ring taken along line 4—4 of FIG. 3.

FIG. 4 shows a portion of base 110 defining grooves 140 and supporting substrate 102. Ribs 126 are formed in base 110 with grooves 140 defined between adjacent ribs 126. FIG. 4 also illustrates substrate wear particles 104 within one of the grooves 140. Wear particles 104 are thus kept away from substrate 102, and more importantly, from between substrate 102 and base surface 120 at the top 127 of ribs 126.

Grooves 140 are preferably sized to catch wear particles 104 from the substrate 102. The largest of wear particles 104 have been found to be about 5 microns to about 10 microns wide. Grooves 140 are preferably wider than the largest wear particles 104 and are deep enough to allow multiple wear particles 104 to fall into the grooves 140 so that multiple cycles of carrying substrate 102 pieces can be accomplished before cleaning of the grooves 140 becomes necessary.

Figure 5:
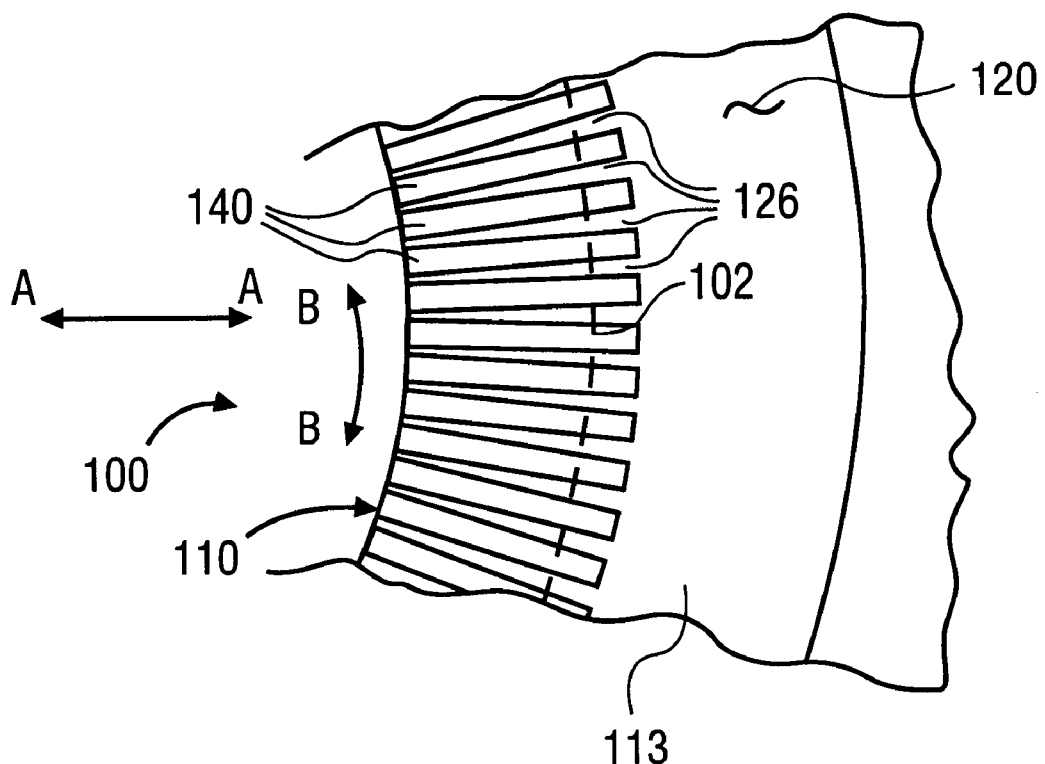
FIG. 5 is an enlarged partial top plan view of a portion of the edge ring of FIG. 4 taken along line 5—5 of FIG. 3.

FIG. 5 shows a portion of base 110 having grooves 140 defined between ribs 126 on base surface 120. Referring again to the embodiment shown in FIG. 1, base surface 120 is on annulus 113 of base 110.

Radial grooves 140 and ribs 126 are preferred for a support apparatus for use in RTP in particular because the thermal expansion and contraction of the substrate 102 causes the substrate surface to move radially relative to the support location 130 (illustrated in FIG. 5 by arrows A-A). The substrate 102 shown in FIG. 5 thus slides along ribs 126, rather than across ribs 126. Relative motion parallel to ribs 126 is less likely to cause scratching of the substrate than relative motion across ribs 126.

Figure 6:
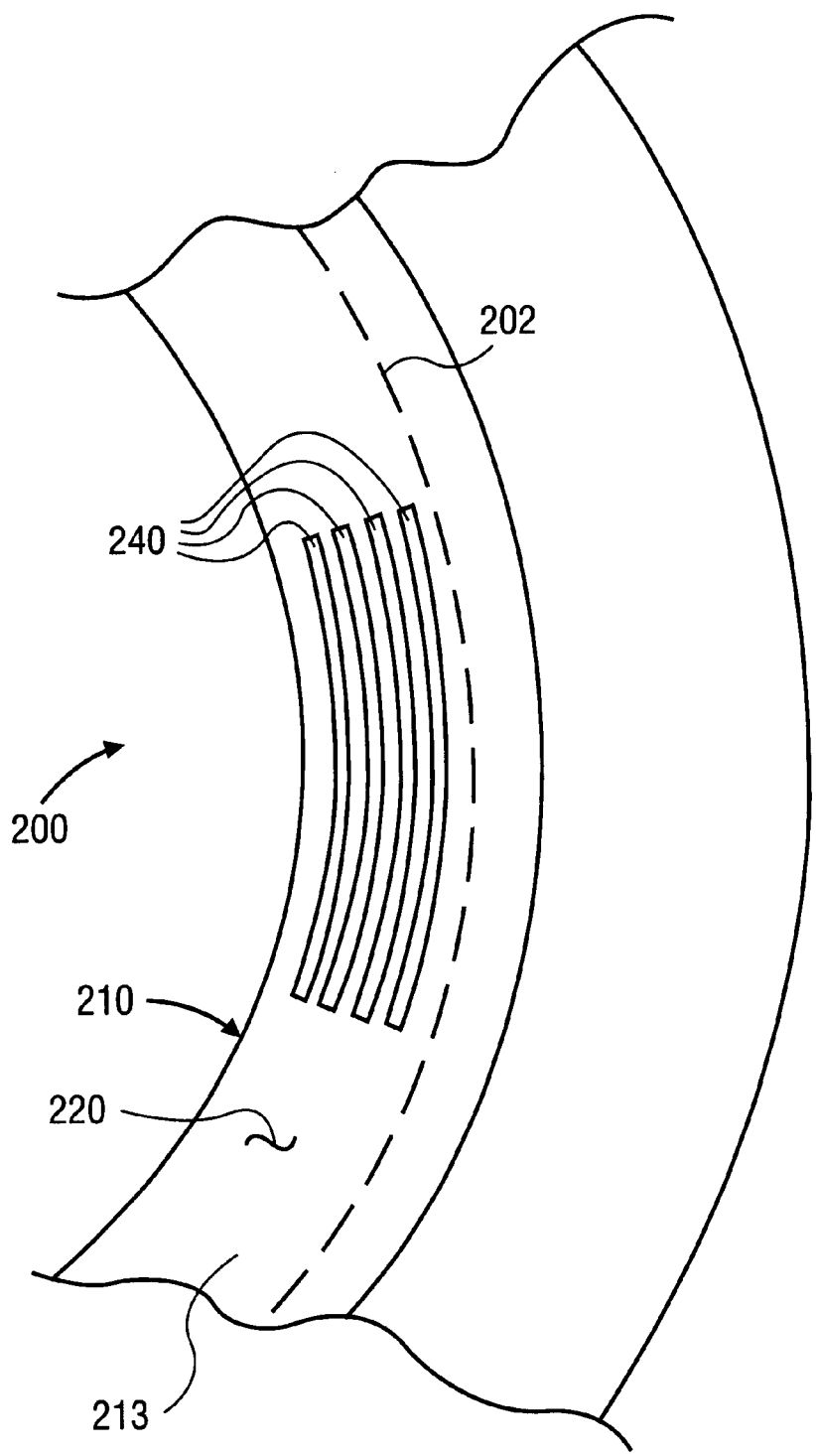
FIG. 6 is an enlarged partial top plan view of an edge ring showing an alternative embodiment of grooves.

In an alternative embodiment shown in FIG. 6, edge ring 200 includes a base 210 that defines arcuate grooves 240 that are each generally coaxial with annulus 213. Arcuate grooves 240 provide an advantage when the relative movement between the substrate 202 and the base surface 220 is in an arcuate direction, such as when the edge ring 200 rotates, for example.

Figure 7:
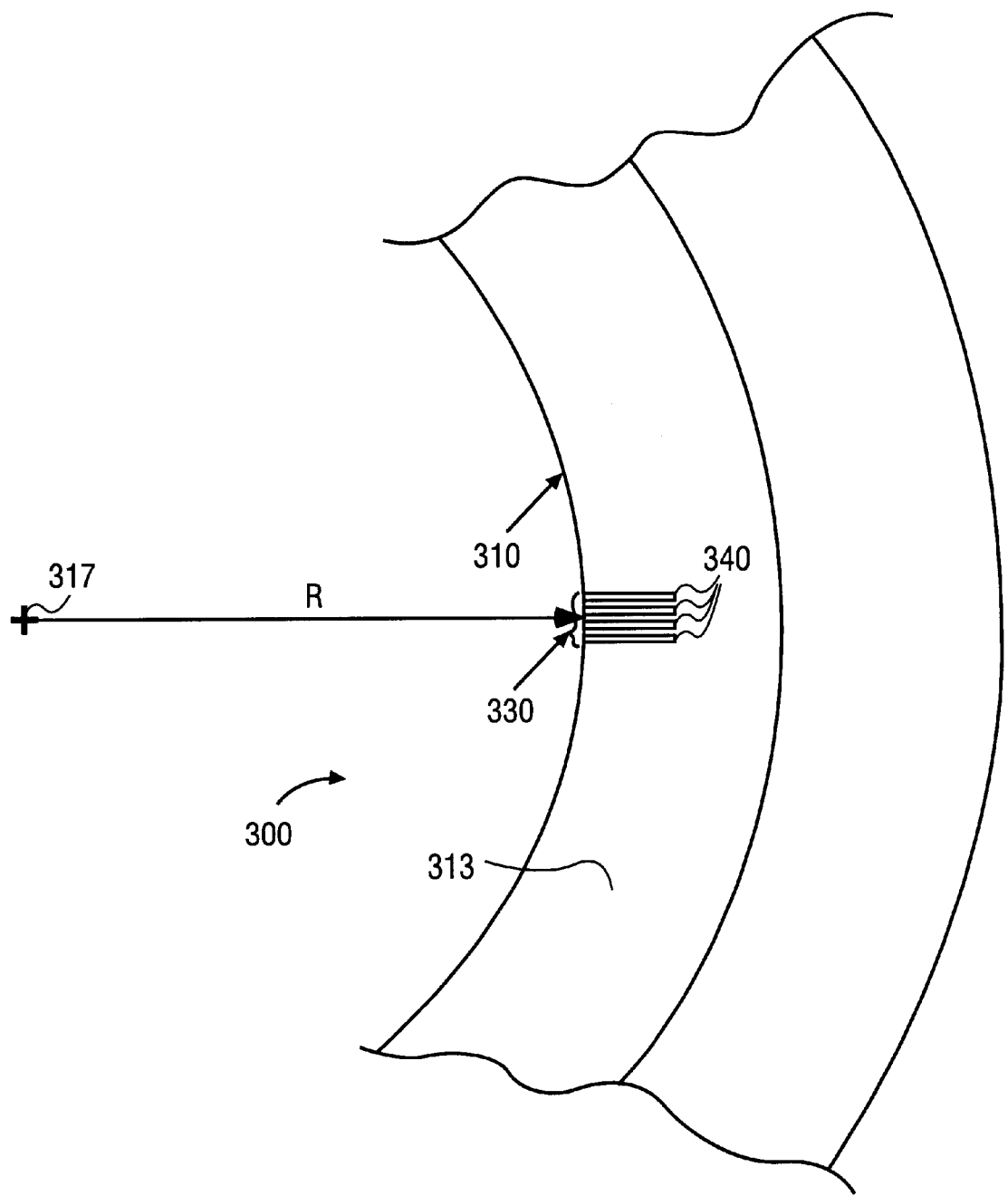
FIG. 7 is an enlarged partial top plan view of an edge ring showing another alternative embodiment of grooves.

Yet another alternative embodiment of grooves is shown in FIG. 7 in which edge ring 300 includes base 310 defining grooves 340 formed generally parallel to a radius R defined between a substrate support location 330 and the axis 317 of annulus 313. Parallel grooves 340 provide constant groove width over the length of each groove 340.

Referring again to FIG. 1, edge ring 100 comprises a base 110 having a circular shape. It should be noted, however, that a support apparatus embodying the present invention need not have a particular shape or configuration. For example, the base of a support apparatus embodying the present invention can be rectangular or any shape that can provide a support for a substrate. The substrate can also have any shape. For ease of description and because of their common use in the semiconductor manufacturing industry, circular or disk-shaped silicon substrates or wafers are referred to in this description. The substrate 102, however, is to be generally considered a work piece to be processed.

In FIGS. 1 and 2, a support cylinder 119 extends downwardly from the bottom side 114 of base 110 under rim 115. Support cylinder 119 can be configured to be received by another part of a machine that carries the edge ring 100. Alternatively, a protrusion or series of protrusions can be provided in place of support cylinder 119 that can be received by another part of a machine. Yet another alternative embodiment of edge ring 100 includes a mechanism such as a locking device for attaching the edge ring 100 to a machine. The bottom side 114 of the base 110 can alternatively be configured to receive a mating portion of a machine in any way known to those skilled in the art which allows the edge ring 100 to be mated or mounted, removably or fixedly, to another part of a machine on which the edge ring 100 can be used.

Base 110 is generally ring-shaped (FIG. 1) and has a top side 112 and a bottom side 114, as shown in FIG. 2. FIG. 1 shows an annulus 113 of base 110 and a rim 115 surrounding annulus 113. Preferably, annulus 113 and rim 1 15 are generally parallel and coaxial, and annulus 113 is in a plane slightly below that of rim 115 as shown in FIG. 2. A cylindrical step 116 connects annulus 113 and rim 115. The step 116 and the annulus 113 form a cylindrical pocket 111. Pocket 111 is dimensioned to receive the substrate 102. Annulus 113 has a central axis 117, shown in FIG. 2, and defines a central opening 118 with its inner diameter.

In an alternative embodiment, annulus 113 can be provided on an adapter ring that is carried by base 110. An adapter ring can be sized to receive smaller diameter substrates, for example.

As further shown in FIG. 2 and 3, substrate 102 is placed on edge ring 100 such that annulus 113 supports substrate 102 near the outer circumference of substrate 102. The inner diameter of annulus 113 is preferably slightly smaller than the outer diameter of substrate 102.

Edge ring 100, as shown in FIGS. 1–5, includes a base 110 that defines grooves 140 around the circumference of annulus 113. While grooves 140 provide the wear particle 104 trapping feature of the present invention, the large number of grooves 140 in the embodiment of FIGS. 1 and 5 may require a lengthy inspection or cleaning process. An alternative embodiment of a support apparatus of the present invention is shown in FIGS. 8 and 9.

Figure 9:
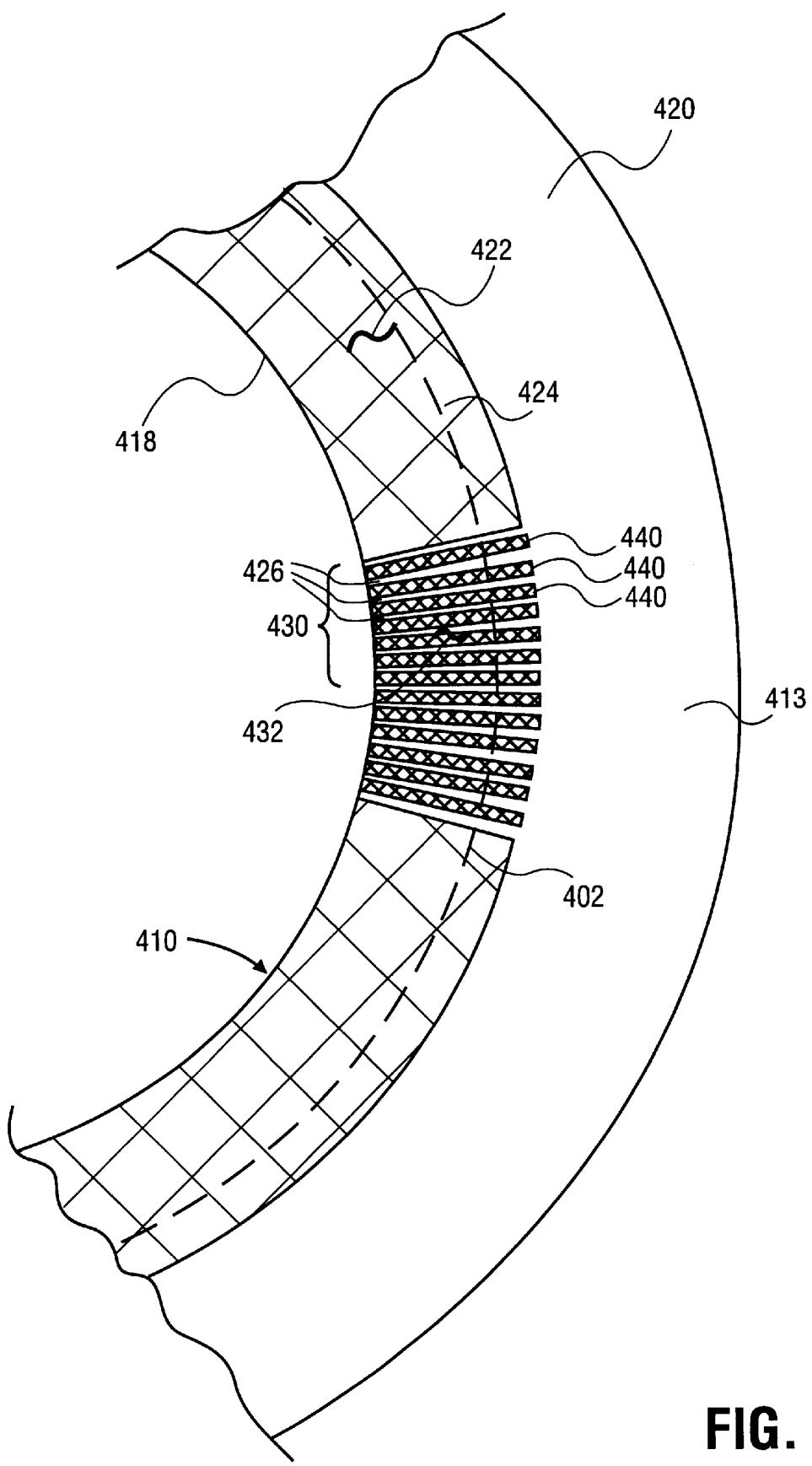
FIG. 9 is an enlarged partial top plan view of a portion of the edge ring of FIG. 8.

FIG. 9 shows an edge ring 400 including a base 410 that includes a base surface 420 on its top side 412. Base surface 420 has a substrate support location 430 located on annulus 413 near the inner diameter of annulus 413. Preferably, a plurality of substrate support locations 430 is provided on base surface 420. Substrate support locations 430 are preferably spaced circumferentially around annulus 413. As described below, substrate support locations can comprise a rib, a group of ribs, a protrusion, or a protrusion having grooves.

Figure 8:
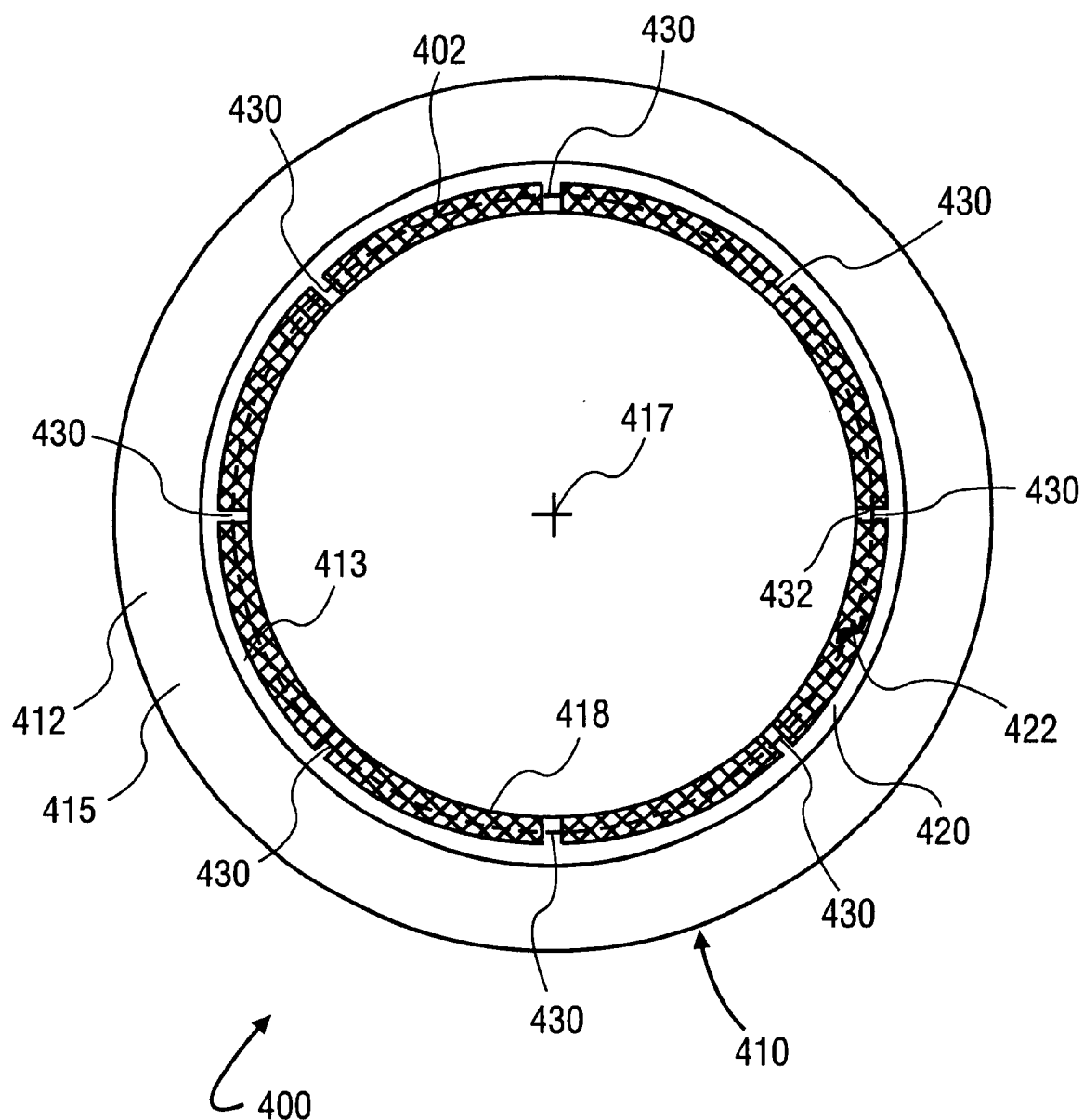
FIG. 8 is a top plan view of an alternative embodiment of an edge ring.

The example of the edge ring 400 shown in FIG. 8 includes eight substrate support locations 430 for illustrative purposes. A preferred number of substrate support locations 430 is 48, each circumferentially spaced 7.5° apart from adjacent locations 430 on annulus 413. A greater number of substrate support locations 430 provides a greater weight distribution when the substrate 402 rests on the edge ring 400. A lesser number decreases the total area of contact between the substrate 402 and the base 410. It is desirable to decrease the total contact area in order to minimize the number of locations that must be monitored for defects.

As the number of substrate support locations 430 decreases, however, the force of the weight of the substrate 402 on each location increases, thus increasing the chance of a scratch at each location. Also, as the amount of friction between the substrate 402 and the base surface 420 decreases because of fewer contact points, the chance of the substrate 402 slipping increases. Slippage results on relative movement, which can cause scratches. The optimal number of substrate support locations 430 will depend on a number of design factors such as size and weight of substrate 402 and width or diameter of annulus 413, for example. The ideal number of substrate support locations 430 for a given base 410 design and corresponding substrate 402 size will be a quantity sufficient to accomplish adequate support of substrate 402 with a minimum of contact with the base 410 and without detrimentally increasing the force due to gravity of the substrate 402 at each substrate support location 430.

When the support apparatus of the present invention is used in RTP, the substrate support locations 430 hold the substrate 402 above base surface 420 and are spaced to prevent substrate 402 contact with the base surface 420 between substrate support locations 430 when the substrate 402 is heated to the point that it is soft and can sag between substrate support locations 430. The height of the substrate support locations 430 relative to base surface 420 can be selected to prevent contact of the substrate 402 with base surface 420 when the substrate 402 is heated.

As shown in FIG. 9, base surface 420 includes a base surface area 422, and each substrate support location 430 has a support surface area 432. Base surface area 422 is the entire surface area of the annulus 422. Base surface area 422 can alternatively be defined as the surface area which is covered by substrate 402 when the substrate 402 is resting on the base 410. Base surface area 422 may not include the entire surface area of the annulus 413 if the outer diameter of substrate 402 is smaller than that of the annulus 413. Substrate support area 432 is defined as the total surface area of the portions of the substrate support locations 430 that actually contact the substrate 402 as it rests on the base 410.

Preferably, the support surface area 432 is substantially less than base surface area 422. The difference in the surface areas is attributed in part to grooves 440 defined in base 410 as described in detail below. The support surface area 432 being substantially less than the base surface area 422 also helps provide the minimal contact area with the substrate 402 as discussed above. Also, a smaller contact area between the substrate support location 430 and substrate 402 provides a decrease in thermal coupling from the substrate 402 to the edge ring 400. A decrease in heat transfer between the substrate and its carrier provides improved control of the distribution of heat energy absorbed by the substrate during a process such as RTP.

Referring to FIG. 9, base 410 defines grooves 440 at substrate support location 430. The crosshatched areas of FIGS. 8 and 9 indicate areas where material has been removed from the base 410, thus lowering a portion of base surface 420. Grooves 440 are defined when ribs 426 are left extending from base surface 420.

Referring again to FIG. 9, substrate support location 430 is preferably about 0.58 millimeters wide at the inner diameter of annulus 413. Grooves 440 preferably have a radial length of about 2.0 millimeters. Each substrate support location 430 of FIGS. 8 and 9 preferably includes about 15 grooves defined in base 410. Preferably, grooves 440 are formed generally radially on base 410 with respect to annulus 413.

Figure 10:
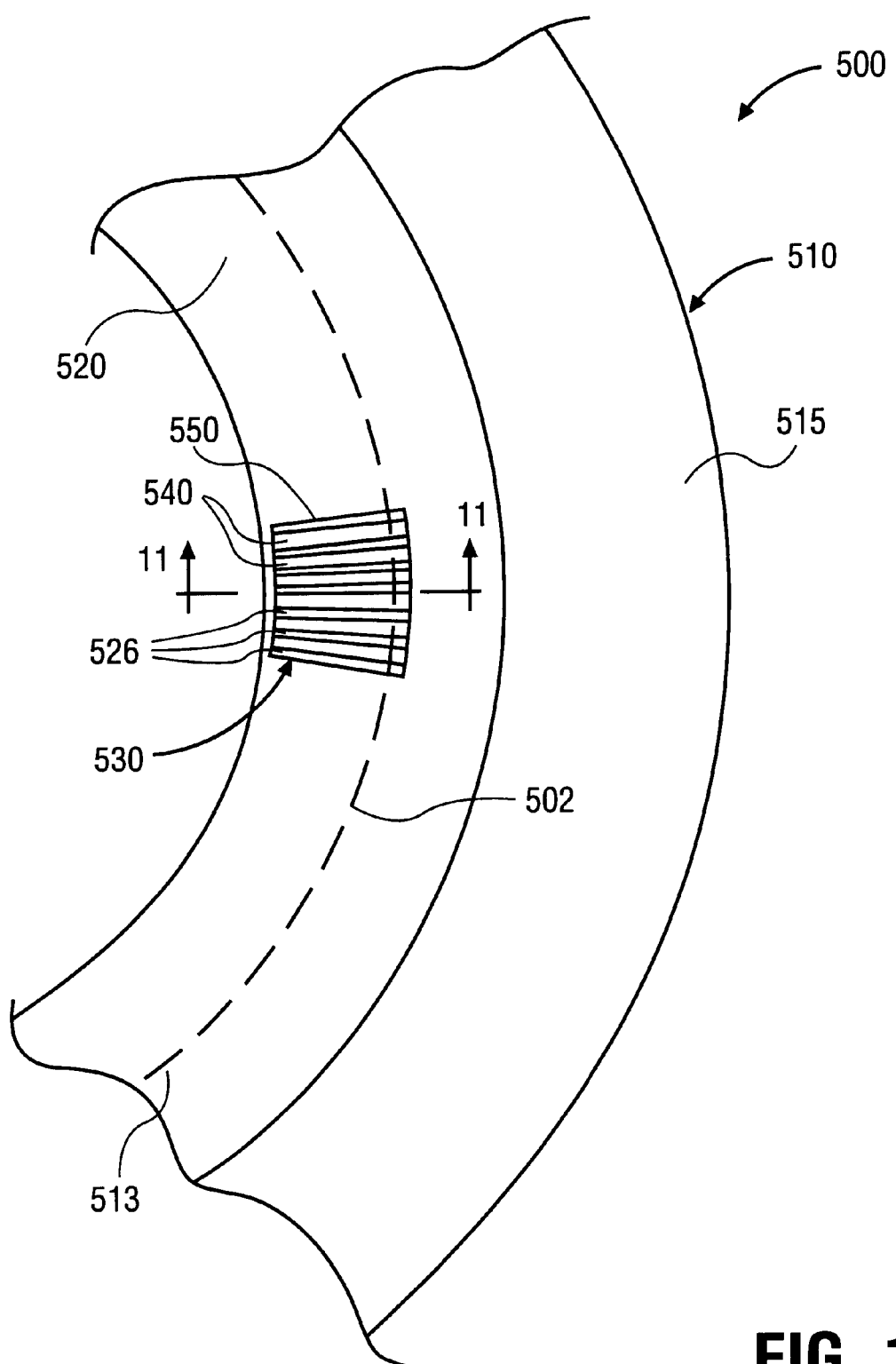
FIG. 10 is an enlarged partial top plan view of an edge ring showing an alternative embodiment of a substrate support location.

Another alternative embodiment of a substrate support apparatus of the present invention is shown in FIG. 10. Edge ring 500 is similar to that of FIGS. 1–9. Edge ring 500 includes a base 510 defining a base surface 520. Base 510 is similar to base 110 previously described in that base 510 also includes an annulus 513. Base surface 520 also includes a substrate support location 530. Preferably, a plurality of substrate support locations 530 is provided, the plurality of locations 530 being spaced circumferentially around annulus 513.

Figure 11:
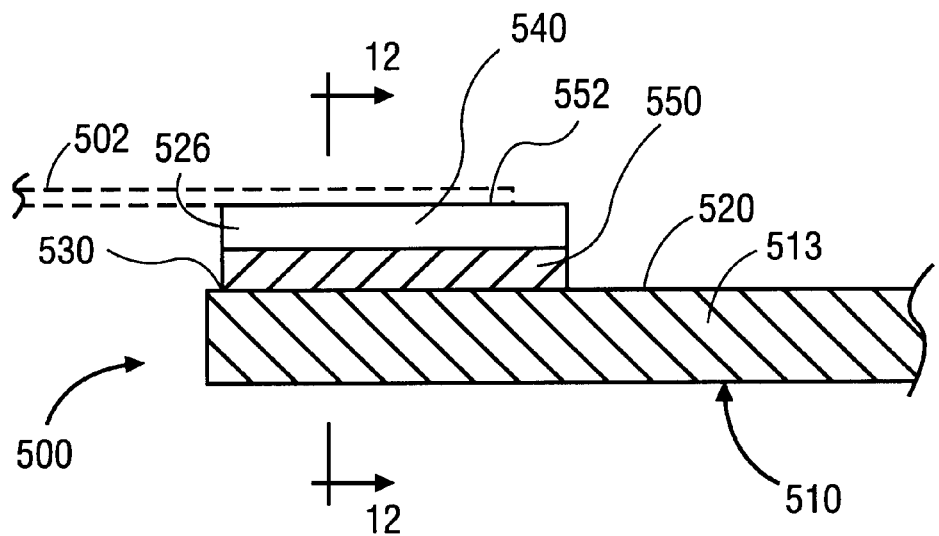
FIG. 11 is an enlarged partial cross-sectional view of the substrate support location of FIG. 10 taken along line 11—11 of FIG. 10.
Figure 12:
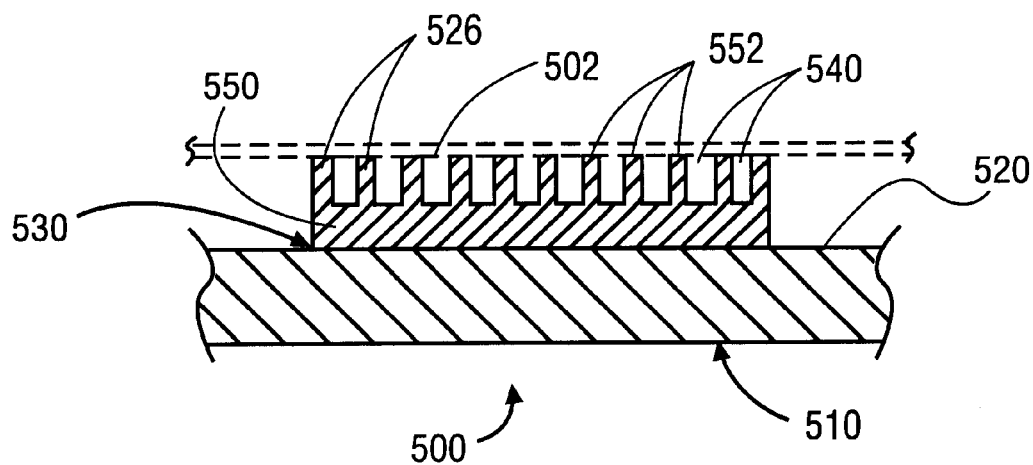
FIG. 12 is a cross-sectional view of the substrate support location of FIG. 11 taken along line 12—12 of FIG. 11.

A protrusion 550 extends from base surface 520. Preferably, a plurality of protrusions 550 is provided which are spaced circumferentially around the annulus 513 and which are each located at a corresponding one of substrate support locations 530. As shown in FIG. 11 and 12, protrusion 550 has a contact surface 552 on which substrate 502 rests when edge ring 500 holds substrate 502. Contact surface 552 is located at the top of protrusion 550 and is spaced apart from base surface 520. Preferably, contact surface 552 is generally parallel to base surface 520.

In one embodiment, protrusion 550 defines a groove 540 or plurality of grooves 540 formed at its contact surface 552. Preferably, and when a plurality of protrusions 550 is provided, each protrusion 550 defines a plurality of grooves 540 on its corresponding contact surface 552. As previously described with respect to other embodiments, grooves 540 can be formed radially, arcuately, or in any other suitable fashion.

Protrusion 550 can be integral with base 510, i.e., protrusion 550 can be a separate part joined or attached to base 510. Protrusion 550 can also be unitary with base 510, i.e., monolithic.

Figure 13:
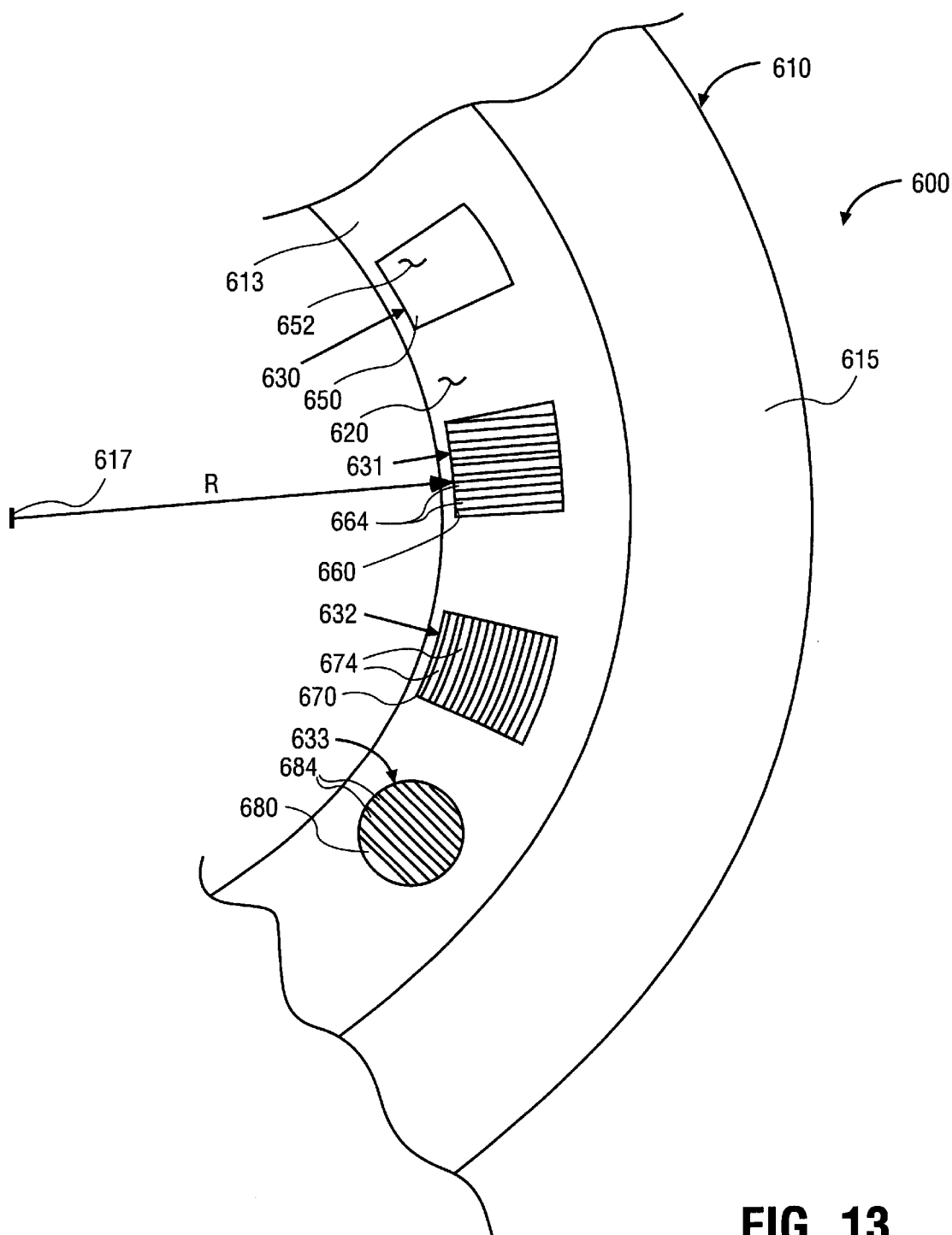
FIG. 13 is an enlarged partial top plan view of a substrate support apparatus showing alternative embodiments of substrate support locations.

FIG. 13 shows alternative embodiments of protrusions. Protrusion 650 extends from base surface 620 at substrate support location 630 and includes contact surface 652. Protrusion 650 does not define grooves. A plurality of protrusions 650 can be provided on annulus 613. Protrusion 650 can alternatively be defined as a rib extending from base surface 620.

Protrusion 660 also extends from base surface 620 and defines grooves 664 that are parallel to a radius R which is between axis 617 of annulus 613 and substrate support location 631.

Protrusion 670 is at substrate support location 632 and defines arcuate grooves 674.

Protrusion 680 is an example of an alternative shape of protrusion. Protrusion 680 is circular. As shown in FIG. 13, protrusion 680 can define grooves 684.

A preferred material that can be used to form any of the described embodiments of the base and protrusions of the substrate support apparatus is silicon carbide. The base and protrusions need not be formed of the same materials. For example, the base can be made of a first material, preferably a non-contaminating, semiconducting dielectric or ceramic such as SiC for example, and protrusions or ribs can be made of a second material.

It should be noted that any combination of protrusion shape, size, location, number, and groove definitions could be provided without departing from the scope of the invention. FIG. 13 is simply an illustration of several non-inclusive alternative embodiments of protrusions.

Figure 14:
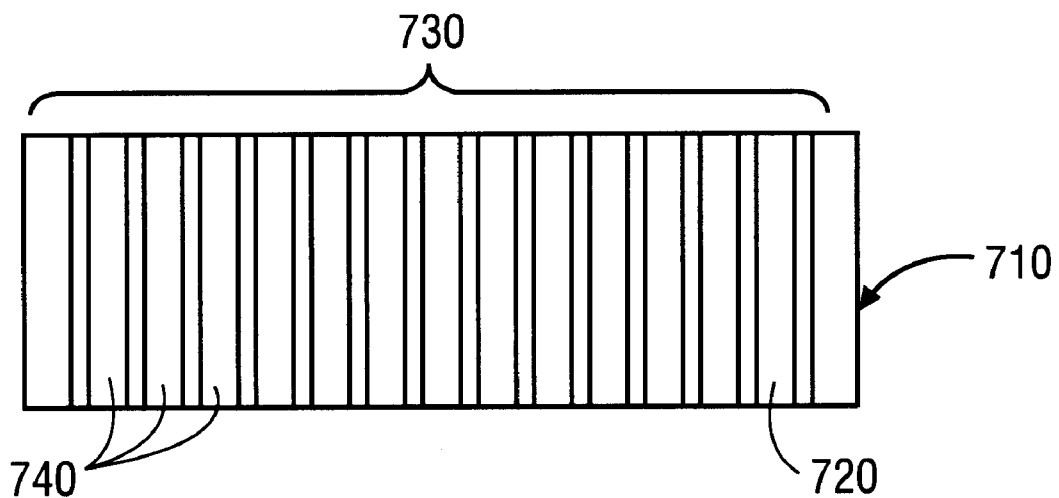
FIG. 14 is a top plan view of an alternative embodiment of a substrate support apparatus.
Figure 15:
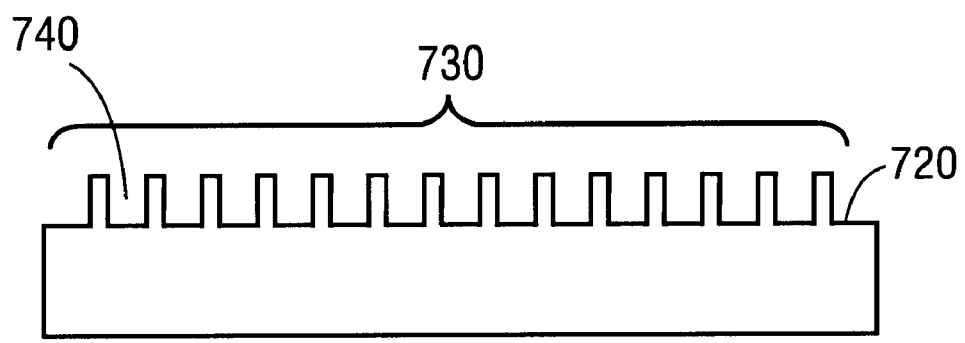
FIG. 15 is a front elevational view of the apparatus of FIG. 14.

FIGS. 14 and 15 show an alternative embodiment of a base 710 that is rectangular. Base 710 includes a base surface 720 having a substrate support location 730 that covers generally the entire base surface 720. Base 710 defines grooves 740 formed at substrate support location 730; thereby having grooves 740 defined on generally the entire base surface. Of course, a configuration of grooves 740 being defined on the entire base surface is not limited to rectangular base 710. It should be noted that any base surface shape could accommodate any configuration of grooves. Also, the grooves need not be straight or arcuate, but can be defined in other shapes such as wavy or curved.

Figure 16:
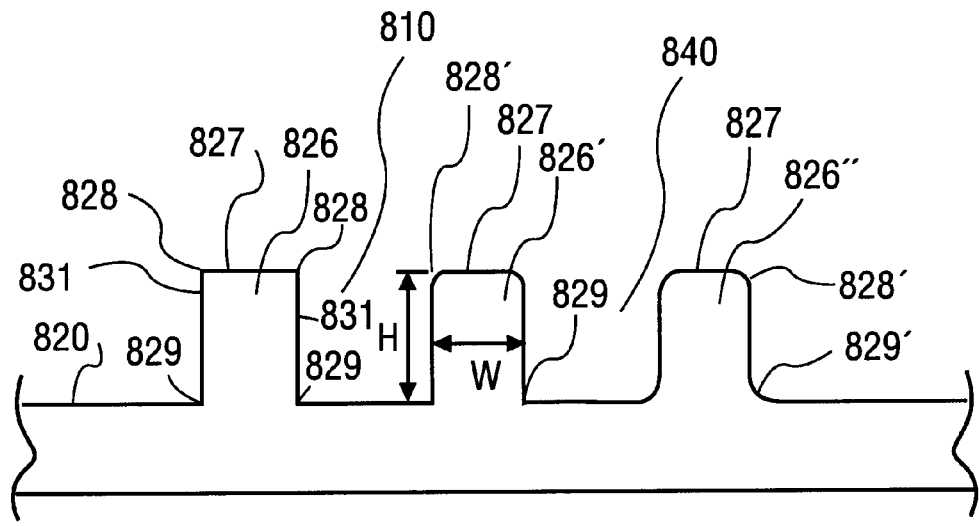
FIG. 16 is a front elevational view of grooves and ribs formed at a substrate support location.

FIG. 16 shows a portion of a substrate support location including ribs 826. Grooves 840 are defined between ribs 826. Ribs 826 are generally rectangular and can extend from base surface 820 or any previously described protrusion. Ribs 826 each include a top surface 827. Each top surface 827 is bordered by a corresponding edge 828 adjacent to each lateral side 831 of ribs 826. Edge 828 is preferably rounded as shown in FIG. 16 at ribs 826' and 826". Rounded edges 828' on ribs 826' and 826" help to prevent microcutting of the substrate. Also, interior corner 829 is defined where rib 826 meets base surface 820. Preferably, interior corner 829' is rounded as shown at rib 829.

In a preferred embodiment, ribs 826 have a height H of about 10 microns to about 20 microns and a width W of about 10 microns. Grooves 840 are preferably about 20 microns wide. The radii of the rounded edge 828' and the rounded interior corner 829' are each preferably about 2 microns to about 3 microns.

The grooves in the substrate support apparatus of the present invention can be formed by any machining method known in the art that can produce very small grooves in a base material. Preferably, laser machining is used to cut the grooves in the base. A laser beam can be directed at the base to remove material from the base, thus forming grooves. Referring again to FIGS. 8 and 9, for example, the cross-hatched areas on annulus 413 indicate where material has been removed from base 410. As shown in FIG. 9, material has been removed at base surface area 422, leaving radial, elongated portions or generally rectangular ribs 426 at substrate support location 430. Grooves 440 are defined between ribs 426.

Similarly, grooves 540 can be cut in protrusion 550 of FIGS. 10–12. Ribs 526 are left such that grooves 540 are defined between ribs 526. Protrusions 550 can be formed by removing material from base 510, leaving protrusions 550 extending from base 510. Alternatively, material can be added to the base 510 to form protrusions 550.

Referring now to FIG. 16, rounded edges 828' are preferably formed from edge 828 by removing rib 826 material with a laser beam. Alternatively, any suitable and well-known machining technique can be used to accomplish rounding of edges 828.

Figure 17:
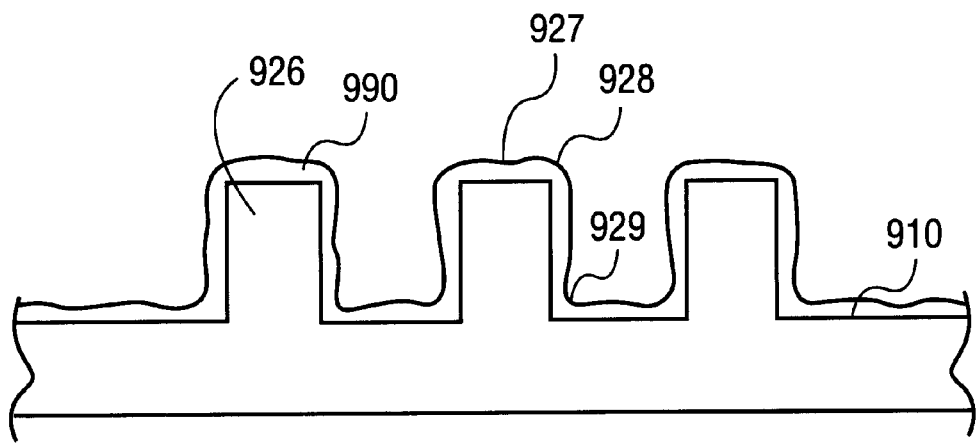
FIG. 17 is a front elevational view of an alternative embodiment of grooves and ribs formed at a substrate support location.

Another method of rounding edges 928 of ribs 926 is shown in FIG. 17. A coating material 990 is deposited on rib 926 to provide rounded edges 928 adjacent top surface 927 and rounded interior corners 929 where rib 926 meets base surface 910. Coating material 990 can be deposited by chemical vapor deposition, sputtering, or any well-known method. Coating material 990 can preferably be a non-contaminating, semiconducting ceramic or dielectric film such as SiC, SiN, or $SiO_2$, for example.

Figure 18:
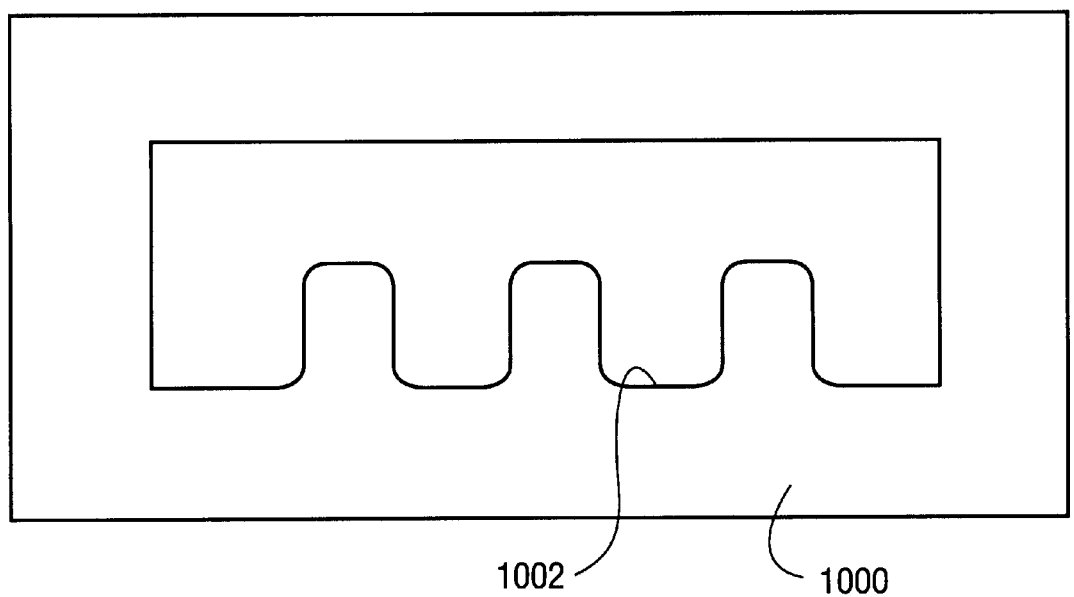
FIG. 18 is a top plan view of a plate including an aperture.

FIG. 18 shows an example of a plate 1000 that is used in an alternative method of cutting grooves and ribs. Plate 1000 defines an aperture 1002 through which a laser beam is fired. Aperture 1002 has a selected shape that is the negative of a selected cross-sectional shape of the grooves and ribs that are to be formed. Aperture 1002 directs the laser beam energy in a selected shape such that base material is only removed where the laser energy contacts it.

Figure 19:
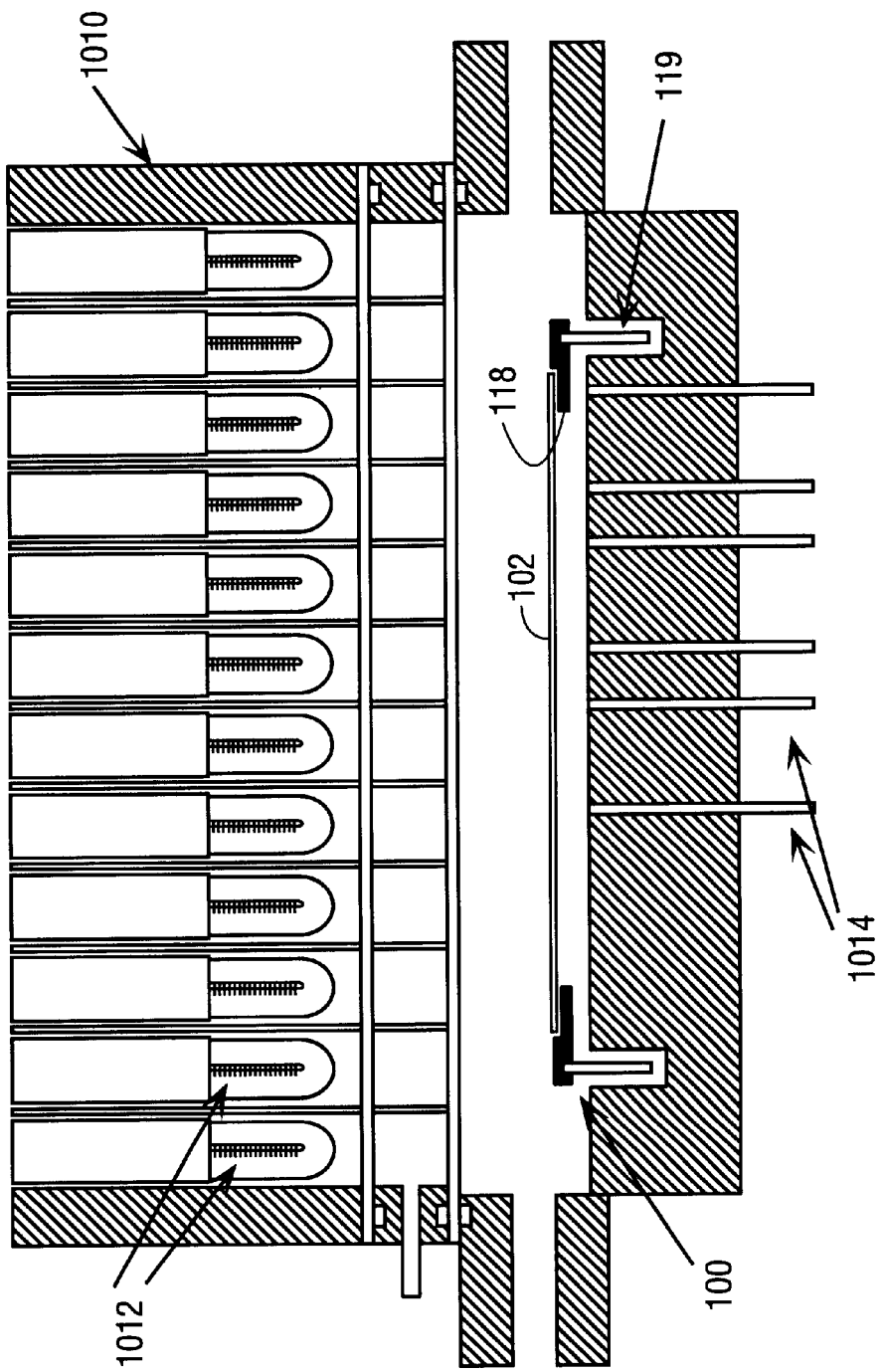
FIG. 19 is a schematic view of an RTP chamber.

FIG. 19 shows an example of an RTP chamber 1010 in which the apparatus described herein can be used. Edge ring 100 is shown carrying substrate 102 in the chamber 1010. Chamber 1010 includes an array of lamps 1012 disposed above edge ring 100. Lamps 1012 provide heat energy to substrate 102 from above. Additional heat sources 1014 can be provided below edge ring 100. Heat energy can be provided from below the substrate by heat sources 1014 through the central opening 118 in edge ring 100.

A novel substrate support apparatus and method of making the apparatus have been described. The novel apparatus helps to reduce wear and resulting defects in a substrate during processing of the substrate. Grooves formed in a base of the support apparatus are sized to trap wear particles and move them away from the contact area between the substrate and the support. It is to be appreciated that a support apparatus of the present invention can be provided by a number of different embodiments of base surfaces and groove designs without departing from the present invention.

What is claimed is:

1. A substrate support apparatus comprising:
   a base defining a base surface;
   at least one protrusion extending from said base surface and perpendicular to said base surface, said protrusion having a top surface generally parallel to said base surface; and
   a substrate support location on said surface of said at least one protrusion, said at least one protrusion defining at least one groove perpendicular to said base surface in said top surface at said substrate support location.

2. The apparatus of claim 1 wherein said base comprises an annulus having an axis, and said base defines a central opening along said axis.

3. The apparatus of claim 2 further comprising a plurality of protrusions spaced circumferentially around said annulus.

4. The apparatus of claim 3 wherein said grooves of each protrusion are generally parallel to a radius defined between a corresponding one of said protrusions and said axis of said annulus.

5. The apparatus of claim 1 wherein said at least one groove is formed generally radially with respect to said annulus.

6. The apparatus of claim 2 wherein said at least one groove is generally arcuate with respect to said annulus.

7. The apparatus of claim 1 wherein said base is a ceramic material.

8. The apparatus of claim 1 wherein said base is a dielectric material.

9. The apparatus of claim 1 wherein said base is silicon carbide.

10. The apparatus of claim 1 wherein said protrusion is silicon carbide.

11. The apparatus of claim 1 wherein said base is a first material and said protrusion is a second material.

12. A substrate support apparatus comprising:
    a base having a base surface;
    a protrusion extending from said base perpendicular to said base surface; and
    a plurality of ribs extending from said protrusion generally perpendicular to said base surface, said ribs defining grooves between adjacent ones of said ribs, each of said ribs having a top surface generally perpendicular to said grooves and generally parallel to said base surface, said ribs comprising a rib material.

13. The apparatus of claim 12 wherein each of said ribs has a rounded edge adjacent its top surface.

14. The apparatus of claim 13 wherein said rounded edge is formed by removing a portion of said rib material with a laser beam.

15. The apparatus of claim 13 wherein said rounded edge is formed by depositing a coating material on said rib.

16. The apparatus of claim 15 wherein said coating material is deposited by chemical vapor deposition.

17. The apparatus of claim 15 wherein said coating material is deposited by sputtering.

18. The apparatus of claim 15 wherein said coating material is a ceramic material.

19. The apparatus of claim 15 wherein said coating material is a dielectric material.

20. The apparatus of claim 12 wherein each of said ribs has a height of about ten to about twenty microns.

21. The apparatus of claim 12 wherein each of said ribs has a width of about ten microns.

22. The apparatus of claim 12 wherein each of said grooves has a width of about ten to about twenty microns.

23. The apparatus of claim 12 wherein said grooves are sized to catch wear particles, said grooves each having a width larger than a selected size wear particle and a depth sized to allow catching of multiple wear particles.

24. A substrate support apparatus comprising:

a base having a base surface, said base surface comprising an annulus having an axis; and a plurality of protrusions extending from said base surface and spaced circumferentially around said annulus, each of said protrusions having a corresponding contact surface spaced apart from said base surface, each of said protrusions defining grooves formed in said corresponding contact surface.

25. The apparatus of claim 24 wherein said grooves of each corresponding contact surface are generally parallel to a radius defined between a corresponding one of said protrusions and said axis of said annulus.

26. The apparatus of claim 24 wherein said grooves are sized to catch wear particles, said grooves each having a width larger than a selected size wear particle and a depth sized to allow catching of multiple wear particles.

27. A substrate support apparatus comprising:

a base having a base surface; and a protrusion extending from said base surface, said protrusion having a contact surface spaced apart from said base surface, said protrusion defining grooves formed in said contact surface, wherein said base is a first material and said protrusion is a second material.

28. The apparatus of claim 27 wherein said grooves are sized to catch wear particles, said grooves each having a width larger than a selected size wear particle and a depth sized to allow catching of multiple wear particles.

29. A substrate support apparatus comprising:

a base having a base surface;

a protrusion extending from said base surface; and a plurality of generally rectangular ribs extending from said protrusion and defining grooves between adjacent ones of said ribs, each of said ribs having a top surface and comprising a rib material, each of said ribs having a rounded edge adjacent its top surface, said rounded edge is formed by depositing a coating material on said rib, said coating material is deposited by chemical vapor deposition.

30. The apparatus of claim 29 wherein said grooves are sized to catch wear particles, said grooves each having a width larger than a selected size wear particle and a depth sized to allow catching of multiple wear particles.

31. A substrate support apparatus comprising:

a base having a base surface;

a protrusion extending from said base surface; and a plurality of generally rectangular ribs extending from said protrusion and defining grooves between adjacent ones of said ribs, each of said ribs having a top surface and comprising a rib material, each of said ribs has a rounded edge adjacent its top surface, said rounded edge is formed by depositing a coating material on said rib, said coating material is deposited by sputtering.

32. The apparatus of claim 31 wherein said grooves are sized to catch wear particles, said grooves each having a width larger than a selected size wear particle and a depth sized to allow catching of multiple wear particles.

33. A substrate support apparatus comprising:

a base having a base surface;

a protrusion extending from said base surface; and a plurality of generally rectangular ribs extending from said protrusion and defining grooves between adjacent ones of said ribs, each of said ribs having a top surface and comprising a rib material, wherein each of said ribs has a height of about ten to about twenty microns.

34. The apparatus of claim 33 wherein said grooves are sized to catch wear particles, said grooves each having a width larger than a selected size wear particle and a depth sized to allow catching of multiple wear particles.

35. A substrate support apparatus comprising:

a base having a base surface;

a protrusion extending from said base surface; and a plurality of generally rectangular ribs extending from said protrusion and defining grooves between adjacent ones of said ribs, each of said ribs having a top surface and comprising a rib material, wherein each of said ribs has a width of about ten microns.

36. The apparatus of claim 35 wherein said grooves are sized to catch wear particles, said grooves each having a width larger than a selected size wear particle and a depth sized to allow catching of multiple wear particles.

37. A substrate support apparatus comprising:

a base having a base surface;

a protrusion extending from said base surface; and a plurality of generally rectangular ribs extending from said protrusion and defining grooves between adjacent ones of said ribs, each of said ribs having a top surface and comprising a rib material, wherein each of said grooves has a width of about ten to about twenty microns.

38. A substrate support apparatus comprising:

a base having a base surface;

a protrusion extending from said base surface; and a plurality of generally rectangular ribs extending from said protrusion and defining grooves between adjacent ones of said ribs, each of said ribs having a top surface and comprising a rib material, wherein said grooves are sized to catch wear particles, said grooves each having a width larger than a selected size wear particle and a depth sized to allow catching of multiple wear particles.

* * * * *